(12) United States Patent
Yuan et al.

(10) Patent No.: US 10,382,064 B2
(45) Date of Patent: Aug. 13, 2019

(54) EFFICIENT LDPC ENCODER FOR IRREGULAR CODE

(71) Applicant: SK Hynix Inc., Gyeonggi-do (KR)

(72) Inventors: Wei-Hao Yuan, Saratoga, CA (US); Lingqi Zeng, San Jose, CA (US); Aman Bhatia, San Jose, CA (US); Johnson Yen, Fremont, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/018,682

(22) Filed: Feb. 8, 2016

(65) Prior Publication Data

US 2017/0104499 A1 Apr. 13, 2017

Related U.S. Application Data

(60) Provisional application No. 62/240,964, filed on Oct. 13, 2015.

(51) Int. Cl.
*H04L 1/00* (2006.01)
*H03M 13/29* (2006.01)
(Continued)

(52) U.S. Cl.
CPC ..... *H03M 13/2909* (2013.01); *G06F 11/1068* (2013.01); *G11C 29/52* (2013.01); *H03M 13/1102* (2013.01); *H03M 13/118* (2013.01); *H03M 13/1177* (2013.01); *H03M 13/611* (2013.01); *G11C 2029/0411* (2013.01); *H03M 13/116* (2013.01); *H03M 13/1162* (2013.01); *H03M 13/1185* (2013.01); *H03M 13/1197* (2013.01); *H03M 13/616* (2013.01);
(Continued)

(58) Field of Classification Search
CPC ... H04L 1/0057; H04L 1/0041; H04L 1/0009; H03M 13/116; H03M 13/255; H03M 13/1102; H03M 13/616; H03M 13/118; H03M 13/1185; H03M 13/11; H03M 13/1162; H03M 13/1197; H03M 13/2909
See application file for complete search history.

(56) References Cited

U.S. PATENT DOCUMENTS 5,990,955 A * 11/1999 Koz ..................... H04N 19/176
375/240.01
7,451,376 B2 11/2008 Yoshida
(Continued)

FOREIGN PATENT DOCUMENTS

WO 2007085653 A1 2/2007

*Primary Examiner* — April Y Blair
*Assistant Examiner* — Sazzad Hossain
(74) *Attorney, Agent, or Firm* — Kilpatrick Townsend & Stockton LLP (57) ABSTRACT

A first memory location stores circulant contents of portions A, C, E, and B of a parity check matrix H. A second memory location stores circulant column counts of the portions A, C, E, and B. A third memory location stores a dense matrix equal to $(ET^{-1}B+D)^{-1}$, where T is an identity matrix and D and T are also portions of the parity check matrix H. First and second parity information is generated in response to receiving information data. Generating the first and second parity information includes accessing the circular content of the portions A, C, E, and B of a parity check matrix H and accessing the circulant column counts of the portions A, C, E, and B.

20 Claims, 6 Drawing Sheets

(51) Int. Cl.
  *G06F 11/10*   (2006.01)
  *G11C 29/52*   (2006.01)
  *H03M 13/11*   (2006.01)
  *H03M 13/00*   (2006.01)
  *G11C 29/04*   (2006.01)

(52) U.S. Cl.
  CPC .......... *H04L 1/0009* (2013.01); *H04L 1/0041* (2013.01); *H04L 1/0057* (2013.01)

(56) References Cited

U.S. PATENT DOCUMENTS

| | | | |
|---|---|---|---|
| 7,549,105 B2 | 6/2009 | Shen | |
| 7,707,479 B2 | 4/2010 | Niu | |
| 8,065,598 B1* | 11/2011 | Gunnam | H03M 13/116 |
| | | | 714/800 |
| 8,418,023 B2 | 4/2013 | Gunnam | |
| 8,826,109 B2 | 9/2014 | Zhang | |
| 8,929,009 B2 | 6/2015 | Yang | |
| 2005/0257119 A1 | 11/2005 | Blankenship | |
| 2006/0036926 A1* | 2/2006 | Hocevar | H03M 13/118 |
| | | | 714/758 |
| 2006/0107172 A1* | 5/2006 | Hsueh | G11B 20/1866 |
| | | | 714/752 |
| 2007/0283221 A1* | 12/2007 | Kyung | H03M 13/1162 |
| | | | 714/758 |
| 2008/0266962 A1* | 10/2008 | Jeon | G11C 16/26 |
| | | | 365/185.12 |
| 2011/0298011 A1* | 12/2011 | Lee | H01L 25/0657 |
| | | | 257/204 |
| 2013/0031438 A1* | 1/2013 | Hu | G06F 11/1012 |
| | | | 714/752 |
| 2013/0179748 A1* | 7/2013 | Dong | G06F 11/1012 |
| | | | 714/755 |
| 2015/0113031 A1* | 4/2015 | Reinwald | G06F 17/16 |
| | | | 708/520 |

* cited by examiner

EFFICIENT LDPC ENCODER FOR IRREGULAR CODE

CROSS-REFERENCES TO RELATED APPLICATIONS

This application claims priority to U.S. Provisional Patent Application No. 62/240,964, filed Oct. 13, 2015. The disclosure of which is hereby incorporated by reference for all purposes.

BACKGROUND OF THE INVENTION

Non-volatile memory systems such as Solid State Drives (SSDs) are finding new applications in consumer electronics. For example, they are replacing Hard Disk Drives (HDDs), which typically comprise rapidly rotating disks (platters). Non-volatile memories, sometimes referred to as 'flash memories' (for example, NAND and NOR flash devices), are used in media storage, cameras, mobile phones, mobile computers, laptop computers, USB flash drives, etc. Non-volatile memory provides a relatively reliable, compact, cost-effective, and easily accessible method of storing data when the power is off.

Error correcting codes (ECC) are used in memory systems such as NAND flash memory systems to ensure data integrity for the data that is stored in the memory system. ECC have become increasingly important for extending the life cycle of NAND (Negative-AND) flash memory systems. Low density parity-check (LDPC) codes have been utilized to improve the reliability of NAND flash memories. The LDPC codes that conventional encoders utilize are regular LDPC codes rather than irregular LDPC codes.

BRIEF DESCRIPTION OF THE DRAWINGS

Various embodiments in accordance with the present disclosure will be described with reference to the drawings, in which.

DETAILED DESCRIPTION OF THE INVENTION

Embodiments of the invention pertain to methods, systems, and devices for encoding irregular code. Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments. However, it will be apparent that various embodiments may be practiced without these specific details. The figures and description are not intended to be restrictive.

The ensuing description provides examples, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

Furthermore, embodiments may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a computer-readable or machine-readable medium. A processor(s) may perform the necessary tasks.

The following detailed description together with the accompanying drawings in which the same reference numerals are sometimes used in multiple figures to designate similar or identical structures structural elements, provide a better understanding of the nature and advantages of the present invention.

Memory systems use Error correcting codes (ECC) to ensure data integrity. For example, parity bits may be stored in the same memory location with information data, where the parity bits are indicators of whether binary strings of specific bits of the data sum to be an even or odd value. Low density parity-check (LDPC) codes typically include a parity check matrix having rows and columns. The LDPC can be applied to information data (to be encoded) to generate the parity bits, for example. Existing LDPC encoders include encoder architectures that are suitable for regular code. However, the existing LDPC encoders are inefficient in terms of area and power when it comes to irregular code. In general, an LDPC code is "regular code" when the row weight is constant for every column and the column weight is constant for every row. An LDPC that is not "regular" is called "irregular." For an irregular LDPC encoder, the degrees of the nodes on each side of a Tanner graph can vary widely. In terms of the parity-check matrix, H, the weight per row and column is not uniform for irregular LDPC code. Because of the differences between regular and irregular LDPC code, the conventional regular group architecture could be more efficient for encoding with irregular LDPC code. Besides efficiency, power consumption efficiency of memory systems is also desirable. For example, power consumption is a driving factor in TLC (triple level cell) NAND multiple steps programming. This disclosure provides examples of encoders and methods of operating the encoders for irregular LDPC code. The disclosed embodiment offer the potential advantage of being area and power efficient compared to conventional LDPC encoders.

Figure 1:
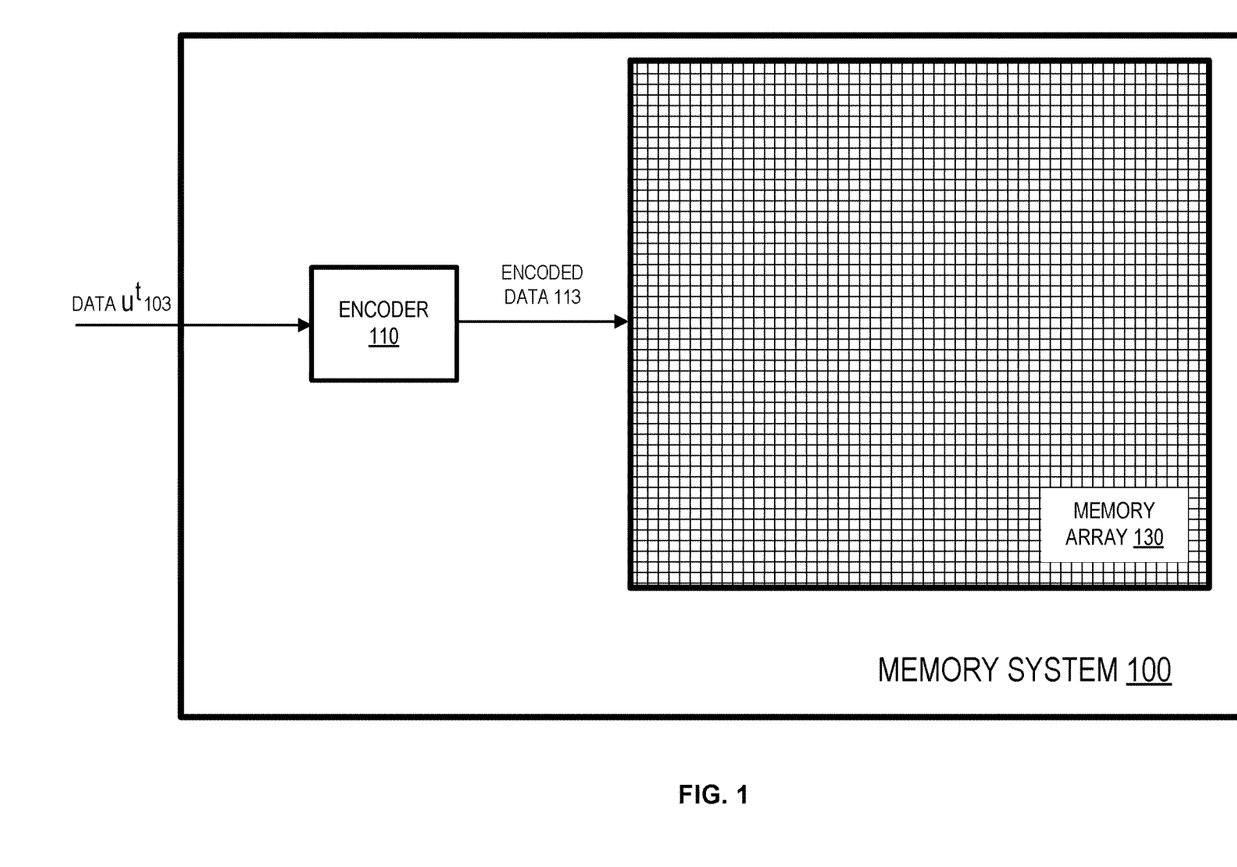
FIG. 1 illustrates an example top-level block diagram of a memory system including an encoder and a memory array.

FIG. 1 illustrates an example top-level block diagram of a memory system 100 including an encoder 110 and a memory array 130. In one implementation, memory system 100 is an example of a memory device, such as a non-volatile memory device. Memory array 130 may be implemented as NAND flash memory and may contain gigabytes of memory locations, for example. Memory system 100 may be included in a computer, a mobile device, a thumb-stick flash drive, or otherwise. In FIG. 1, encoder 110 generates encoded data 113 in response to receiving data 103. Encoded data 113 is then stored in memory array 130. The encoded data 113 includes both received data 103 and parity information generated within encoder 110.

Figure 2:
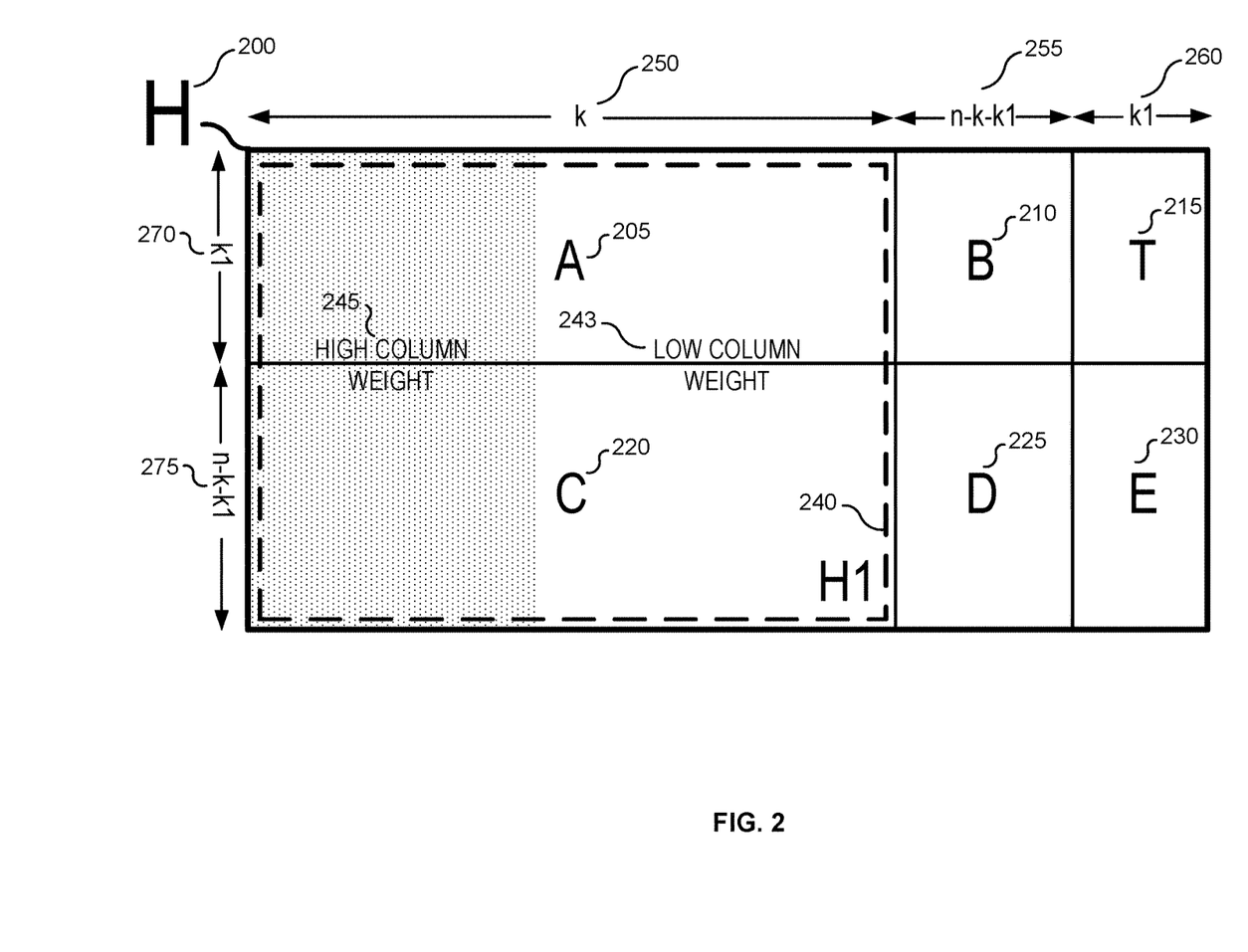
FIG. 2 illustrates an example parity check matrix H.

FIG. 2 illustrates an example parity check matrix H 200. Parity check matrix H includes six portions A 205, B 210, T 215, C 220, D 225, and E 230. The six portion format is generated using the Richardson-Urbanke ("RU") algorithm, as is known in the art. The RU algorithm is described in *Efficient Encoding of Low Density Parity-Check Codes* by Thomas J. Richardson, IEEE Transactions on Information Theory (2001), for example.

For Parity Check Matrix H 200, the Following Equations Apply:

$$H * c^t = [A\ B\ T] \quad (1)$$

$$[C\ D\ E] * [u^t P_1^t P_2^t] = 0 \quad (2)$$

In equation (1), $c^t$ represents a codeword, H represents parity check matrix H 200, and A, B, and T represent A portion 205, B portion 210, and T portion 215, respectively. In equation (2), C, D, and E represent C portion 220, D portion 225, and E portion 230, respectively. Also in equation (2), $u^t$ represents the information data to be encoded, $P_1^t$ represents first parity information, and $P_2^t$ represents second parity information. Generating first parity information $P_1^t$ and second parity information $P_2^t$ is described in more detail below.

In FIG. 2, A portion 205 and C portion 220 have a width 250 of k, where k is the size of the information bits of the data to be encoded, for example, data 103. Also in the illustrated parity check matrix H 200, T portion 215 and E portion 230 have a width 260 of k1, where k1 is the size of the T portion 215, which may be an identity matrix, as described below. B portion 210 and D portion 225 have a width 255 of n-k-k1, where n is the size of the total codeword $c^t$ including information bits and parity bits. A portion 205, B portion 210, and T portion 215 have height 270 of k1, in FIG. 2. C portion 220, D portion 225, and E portion 230 have a height 275 of n-k-k1.

Since H 200 is an irregular parity-check matrix, circulant permutation can be performed to make portion T 215 an identity matrix and reduce the size of dense matrix D. Within the characteristic of column weight not begin uniform in irregular parity-check matrices, portion T 215 can be further enlarged compared to regular parity-check matrix to reduce the number of cycles of dense matrix calculation. In the embodiments of the disclosure, T portion 215 is an identity matrix and T portion 215 can be arranged as a lower triangle matrix to reduce the size of the dense matrix. Having portion T 215 be an identity matrix is potentially advantageous since it need not be stored in memory since it can be easily generated. Since the size of portion T 215 influences the size of D portion 225 (width of D portion 225 is n-k-k1), it may be advantageous to maximize the size of k1 in order to minimize D portion 225, in order to minimize the dense matrix calculation cycles.

Moreover, within further circulant permutation, all of the high column weight can be moved to the head 245 of the H1 240 and keep the low column weight together at the tail 243 of the H1 240. For the purposes of this disclosure, H1 240 is the combination of A portion 205 and C portion 220, or A+C. The high column weight in the head 245 of H1 240 is illustrated by a speckling fill while the remaining low column weight in the tail 243 of H1 240 remains white, as shown in FIG. 2. The matrix format of parity check matrix H 200 is also desirable for area reduction as the circulant content information of portions A 205, C 220, B 210, and E 230 can be merged into a single physical memory location. In one embodiment, the single physical memory location is configured as SRAM. Furthermore, the matrix format of parity check matrix H 200 is also desirable because the location of non-zero circulants per column for portions A 205, C 220, B 210, and E 230 can also be merged and stored in a single memory location, which may also be SRAM.

Figure 3:
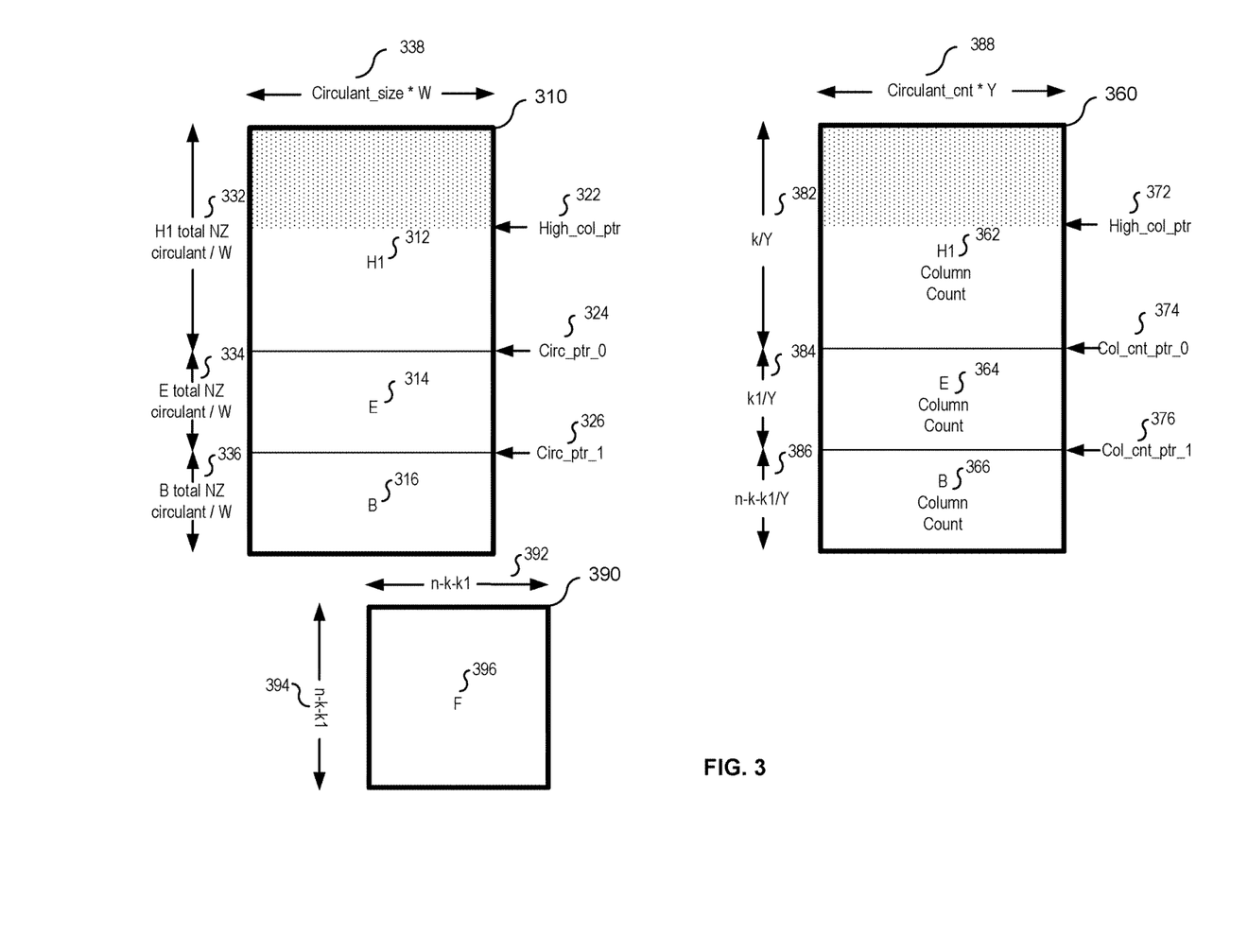
FIG. 3 illustrates three example memory locations accessible by an irregular LDPC encoder.

FIG. 3 illustrates three example memory locations 310, 360, and 390. Memory locations 310, 360, and 390 are accessible by an irregular LDPC encoder. Memory location 310 stores H1 312, E 314, and B 316. H1 312 stores the sparse circulant content of H1 240, E 314 stores the sparse circulant content of E 230, and B 316 stores the sparse circulant content of B 210. Memory location 310 is SRAM, in one embodiment. The width 338 of memory location 310 is the circulant size multiplied by W, where W is the number of non-zero (NZ) circulant content stored in a row of SRAM. In one embodiment, the circulant size is 128. The height 332 of H1 312 is the total NZ circulant content of H1 divided by W. The height 334 of E 314 is the total NZ circulant content of E divided by W. The height 336 of B 316 is the total NZ circulant content of B divided by W.

Since H1, 312, E 314, and B 316 are stored in the same memory location 310, pointers are used to denote boundaries. High_col_ptr 322 is a programmable pointer indicating the boundary between high column weights and the low column weights of H1 312. The high column weights are stored in the top of memory location 310, as indicated by the speckled fill at the top of memory location 310. Circ_ptr_0 324 indicates the boundary between H1 312 and E 314 and Circ_ptr_1 326 indicates the boundary between E 314 and B 316. High_col_ptr 322, Circ_ptr_0 324, and Circ_ptr_1 326 are programmable and may be stored in a memory accessible to encoder logic.

Memory location 360 stores H1 362, E 364, and B 366. H1 362 stores the circulant column count (i.e. how many circulants per column) of H1 240, E 364 stores the circulant column count of E 230, and B 366 stores the circulant column count of B 210. Memory location 360 is SRAM, in one embodiment. The width 388 of memory location 360 is the circulant size multiplied by Y, where Y is the number of the non-zero (NZ) circulant column count stored in a row of SRAM. In one embodiment, the circulant size is 128. The height 382 of H1 362 is k divided by Y, the height 384 of E 364 is k1 divided by Y, and the height 386 of B 366 is n-k-k1 divided by Y.

Since H1, 362, E 364, and B 366 are stored in the same memory location 360, pointers are used to denote boundaries. High_col_ptr 372 is a programmable pointer indicating the boundary between high column counts and the low column counts of H1 362. The high column counts are stored in the top of memory location 360, as indicated by the speckled fill at the top of memory location 360. Col_cnt_ptr_0 374 indicates the boundary between H1 362 and E 364 and Col_cnt_ptr_1 376 indicates the boundary between E 364 and B 366. High_col_ptr 372, Col_cnt_ptr_0 374, and Col_cnt_ptr_1 376 are programmable and may be stored in a memory accessible to encoder logic. In one embodiment, SRAM 360 is smaller than SRAM 310. In one possible example, SRAM 360 has a width of 32 bits and a height of 40 bits.

Memory location 390 in FIG. 3 stores dense matrix F 396 which is given by:

$$F=(ET^{-1}B+D)^{-1} \quad (3)$$

and where T is an identity matrix, dense matrix F can be represented as:

$$F=(E*B+D)^{-1} \quad (4)$$

Dense matrix F can be pre-calculated to lighten the processing burden of the encoder, such as encoder 110. Having portion T 215 be an identity matrix allows equation (3) to be simplified to equation (4), which may reduce the processing burden. Also, having portion T 215 be an identity matrix is potentially advantageous since it need not be stored in memory since it can be easily generated. Memory location 390 has a width 392 of n-k-k1 and a height of n-k-k1. Memory location 390 is SRAM, in one embodiment.

FIG. 3 shows that the only three memory spaces are need to store the information for parity check matrix H 200, which is less memory space than is conventionally used. One potential advantage of using fewer memory spaces is decreasing the memory logic assigned to facilitate each memory space. The three memory spaces shows how the sparseness of parity check matrix H 200 can be utilized to achieve a more suitable parity check matrix format shown in the three memory locations 310, 360, and 390, for example.

Figure 4:
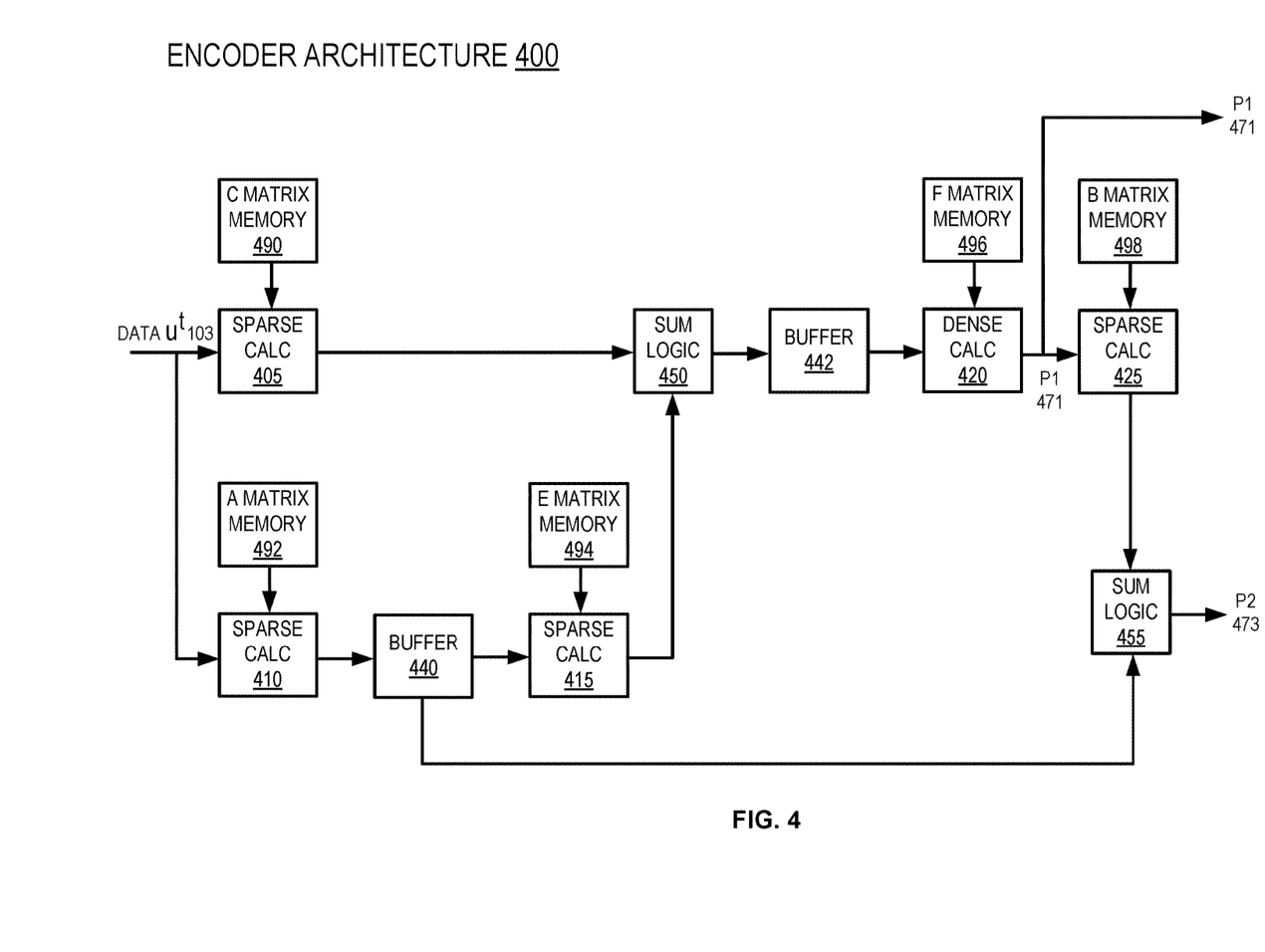
FIG. 4 illustrates an example top-level block diagram of an encoder architecture of an irregular LDPC encoder.

FIG. 4 illustrates an example top-level block diagram of an encoder architecture 400 of an irregular LDPC encoder, such as encoder 110. Encoder architecture 400 may utilize the three memory space format of FIG. 3. Encoder architecture 400 takes advantage of the efficient storage of parity check matrix H 200 in addition to adding its own hardware efficiencies. The efficiency of the storage of parity check matrix H 200 and the efficiencies of encoder architecture 400 may reduce the area, cost, and power consumption of an irregular encoder. Encoder architecture 400 paired with the efficient storage scheme of FIGS. 2 and 3 is suitable for an irregular parity-check matrix and may be used in a NAND controller application, for example.

Encoder architecture 400 generates first parity information $P_1^t$ 471 and second parity information $P_2^t$ 473 in response to receiving data 103. Calculating first parity information $P_1^t$ 471 and second parity information $P_2^t$ 473 is given by the following equations:

$$P_1^t=(ET^{-1}B+D)*(ET^{-1}A+C)*u^t \quad (5)$$

$$P_2^t=T^{-1}*(A*u^t+B*P_1^t) \quad (6)$$

By having portion T 215 be an identity matrix and pre-calculating dense matrix F 396 as in equation (4), equations (5) and (6) can be simplified further to:

$$P_1^t=F*(E*A+C)*u^t \quad (7)$$

$$P_2^t=(A*u^t+B*P_1^t) \quad (8)$$

Pre-calculating dense matrix F 396 and storing in memory location 390 reduces the processing burden of at least some dense matrix calculations for encoder architecture 400.

In FIG. 4, a sparse calculation block 405 receives data 103. Sparse calculation block 405 accesses C Matrix memory 490 to perform a sparse circulant calculation to generate portion C 220 and multiply portion C 220 by data 103. With H1 240 being the combination of portion A 205 and portion C 220, the C Matrix can be reconstructed by accessing H1 312 and H1 362 portions of memory locations 310 and 360, respectively. In FIG. 4, a sparse calculation block 410 also receives data 103. Sparse calculation block 410 accesses A Matrix memory 492 to perform a sparse circulant calculation to generate portion A 205 and multiply portion A 205 by data 103. The A Matrix can be reconstructed by accessing H1 312 and H1 362 portions of memory locations 310 and 360, respectively. The product of portion A 205 and data 103 is stored in buffer 440. Sparse calculation block 415 accesses E Matrix memory 494 to perform a sparse circulant calculation to generate portion E 230 and multiply portion E 230 by the content of buffer 440 (which is $A*u^t$). The output of sparse calculation block 415 is summed with the output of sparse calculation block 405 and stored in buffer 442, in the illustrated embodiment. The contents of buffer 442 is then equal to $(E*A+C)*u^t$. Sum logic 450 includes XOR logic in some embodiments. Dense matrix calculation block 420 accesses F Matrix memory 496 to perform a dense matrix calculation and multiply dense matrix F 396 by the content of buffer 442, in FIG. 4. The output of dense matrix calculation block 420 is $P_1^t$ 471. Having multiplied $((E*A+C)*u^t)$ by dense matrix F, $P_1^t$ 471 is generated, as given in equation (7). Thus, dense calculation block 420 and the blocks prior to dense matrix calculation block 420 generate $P_1^t$ 471 according to equation (7).

Sparse calculation block 425 receives $P_1^t$ 471 from dense calculation block 420, in FIG. 4. Sparse calculation block 425 accesses B Matrix memory 498 to perform a sparse circulant calculation to generate portion B 210 and multiply portion B 210 by $P_1^t$ 471. The product is outputted by sparse calculation block 425 to sum logic block 455. Sum logic block 455 also receives the contents of buffer 440, which is $A*u^t$. Advantageously, sum logic block 455 is able to reuse the contents of buffer 440 in calculating $P_2^t$ 473 since equation (8) also requires multiplying portion A 205 by $u^t$. By summing $A*u^t$ (from buffer 440) and $B*P_1^t$ (from sparse calculation block 425), sum logic block 455 generates $P_2^t$ 473. Thus, encoder architecture 400 generates first parity information $P_1^t$ 471 and second parity information $P_2^t$ 473, but only the generation of first parity information $P_1^t$ 471 is related to dense matrix calculation— once first parity information $P_1^t$ 471 is generated, encoder architecture 400 can apply it in generating second parity information $P_2^t$ 473. Hence, generating second parity information $P_2^t$ 473 only requires sparse matric calculation rather than also requiring dense matrix calculations.

Figure 5:
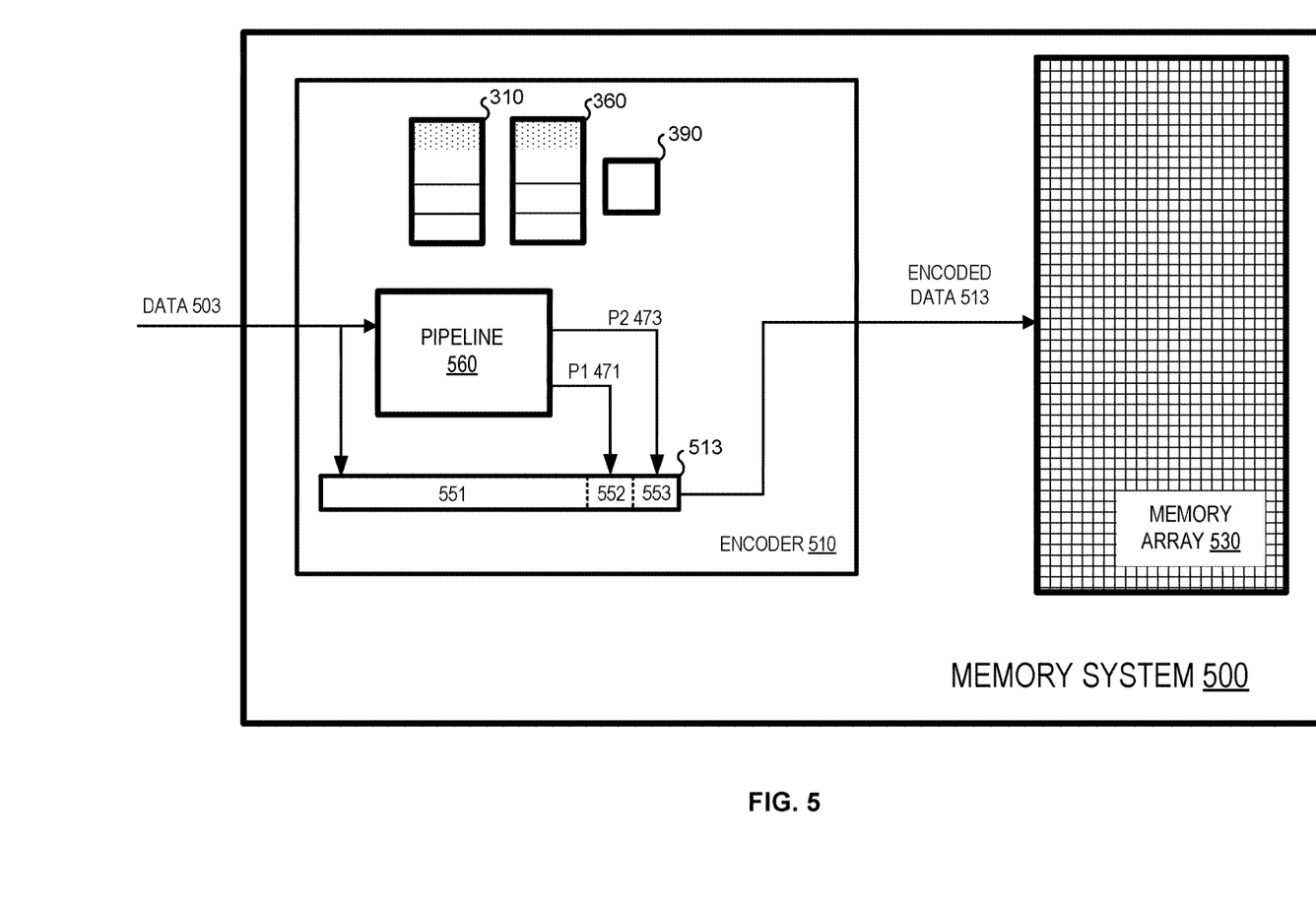
FIG. 5 illustrates an example memory system that includes an example encoder and memory array.

FIG. 5 illustrates an example memory system 500 that includes an example encoder 510 and memory array 530. Encoder 510 includes a pipeline 560 and memory locations 310, 360, and 390. In FIG. 5, memory locations 310, 360, and 390 are illustrated as included in encoder 510, although in some embodiments, memory locations 310, 360, and 390 be accessible to encoder 510, but not necessarily included in encoder 510. Encoder 510 is one example of encoder 110 and memory array 530 is an example of memory 130. Encoder 510 generates first parity information $P_1^t$ 471 and second parity information $P_2^t$ 473 in response to receiving data 503. In the illustrated embodiment, encoded data 513 includes data 503, first parity information $P_1^t$ 471, and second parity information $P_2^t$ 473. More specifically, encoded data 513 includes a data information field 551, a first parity information field 552, and a second parity information field 553. Data 503 populates data information field 551, first parity information $P_1^t$ 471 populates first parity information field 552, and second parity information $P_2^t$ 473 populates second parity information field 553. Encoded data 513 is then stored to a memory location of memory array 530.

In FIG. 5, pipeline 560 may include encoder architecture 400. Memory locations 310, 360, and 390 are accessible to pipeline 560 so that logic or processing resources of pipeline 560 may generate first parity information $P_1^t$ 471 and second parity information $P_2^t$ according to the parity check portions stored in memory locations 310, 360, and 390.

Figure 6:
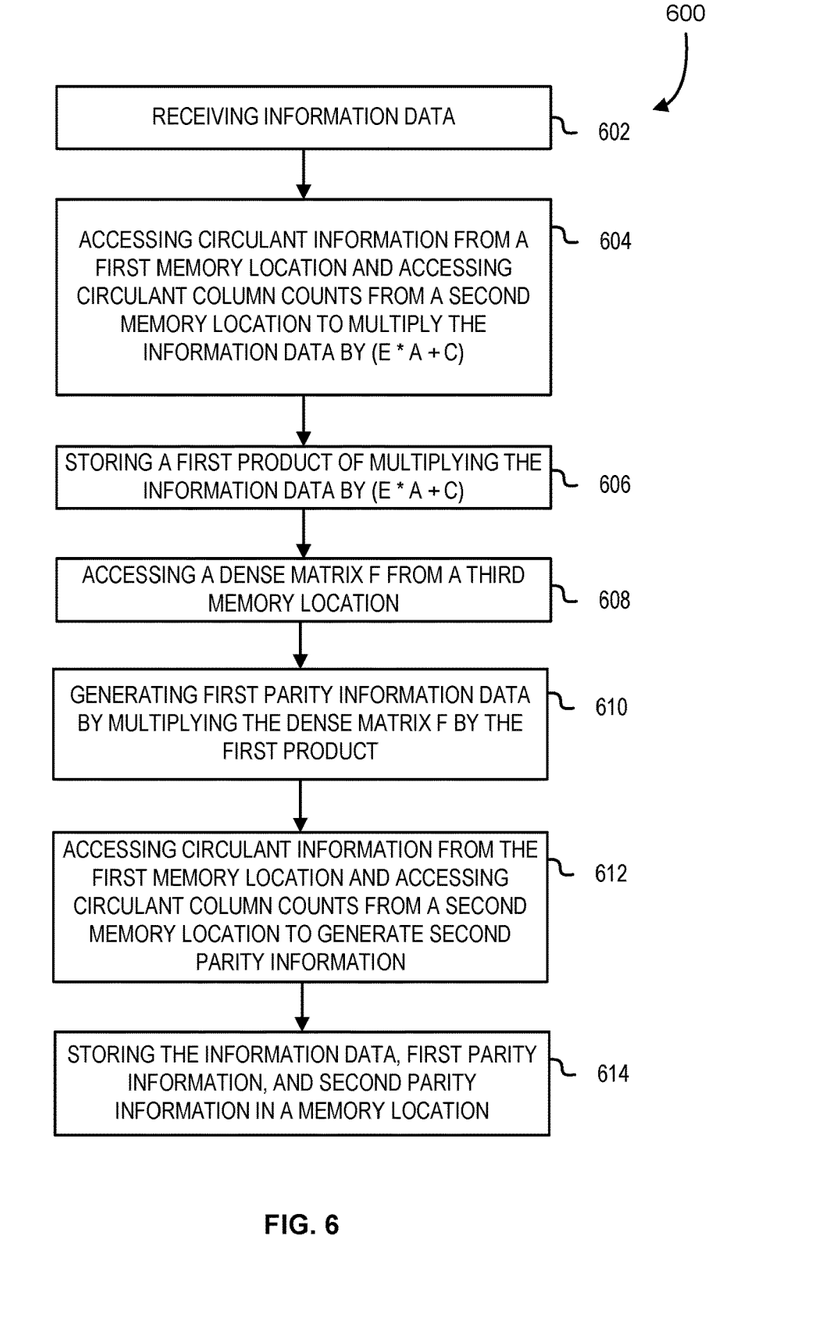
FIG. 6 illustrates an example of a process of generating parity information for use by an LDPC encoder.

FIG. 6 illustrates an example of a process 600 of generating parity information for use by an irregular LDPC encoder, such as encoders 110/510. The process 600 is illustrated as a logical flow diagram, each operation of which represents a sequence of operations that can be implemented in hardware, computer instructions, or a combination thereof. In the context of computer instructions, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types. The order in which the operations are described is not intended to be construed as a limitation, and any number of the described operations can be omitted or combined in any order and/or in parallel to implement this process and any other processes described herein.

Some or all of the process 600 (or any other processes described herein, or variations and/or combinations thereof) may be performed under the control of one or more computer systems configured with executable instructions and may be implemented as code (e.g., executable instructions, one or more computer programs or one or more applications). The code may be stored on a computer-readable storage medium, for example, in the form of a computer program including a plurality of instructions executable by one or more processors. The computer-readable storage medium may be non-transitory.

In process block 602, information data (e.g. 103/503) is received. The information data $u^t$ may be received by encoder 110/510, for example. In process block 604, circulant information from a first memory location (e.g. 310) is accessed and circulant column count information from a second memory location (e.g. 360) is accessed to multiply the information data by (E*A+C). E, A, and C are portions of a parity check matrix H (e.g. 200). In one embodiment, multiplying the information data by (E*A+C) further includes generating a product by multiplying the information data by A and storing the product (e.g. output of sparse calculation block 410) in a buffer (e.g. buffer 440).

Accessing circulant content of a particular portion may include determining a start of the circulant content of a given portion of the parity check matrix H by accessing a circulant pointer (e.g. pointer 324) that points to a first address of the first memory location that marks the start of the circulant content of the particular portion (e.g. portion E 314). Similarly, a start of a circulant column count of the particular portion of the parity check matrix H may be determined by accessing a column count pointer (e.g. pointer 374) that points to a second address of the second memory location that marks the start of the circulant column count of the particular portion (e.g. portion E 364). In this way a matrix, or a portion of parity check matrix H can be reconstructed from the circulant content stored in the first memory location (e.g. 310) and the circulant column count stored in the second memory location (e.g. 360).

One example of executing process block 604 includes, for example, multiplying the information data by (E*A+C) by determining a start of the circulant content of portion E 314 of the parity check matrix H by accessing a circ_ptr_0 324 that points to a first address of the first memory location that marks the start of the circulant content of portion E 314. Similarly, a start of a circulant column count of portion E 364 may be determined by accessing a col_cnt_ptr_0 374 that points to a second address of the second memory location that marks the start of the circulant column count of portion E 364. Other portions of parity check matrix H can be reconstructed by using the disclosed pointers and accessing the memory locations 310 and 360 similarly.

A first product of multiplying the information data by (E*A+C) (e.g. output of sum logic block 450) is stored in a buffer (e.g. buffer 442), in process block 606. In process block 608, dense matrix F is received from a third memory location (e.g. 390). Dense matrix F may be received by dense calculation block 420, for example. Dense matrix F is equal to $(ET^{-1}B+D)^{-1}$, where T is an identity matrix and D and T are also portions of the parity check matrix H (e.g. 200). Dense matrix F may be pre-calculated and stored in the third memory location. First parity information $P_1^t$ is generated in process block 610 by multiplying the dense matrix F by the first product stored in process block 606. Dense matrix calculation block 420 may execute process block 610, in some embodiments. Dense matrix calculation block 420 may include multiple AND gates and XOR gates.

In process block 612, second parity information $P_2^t$ is generated, where $P_2^t$ equals $(A*u^t+B*P_1^t)$. Generating second parity information $P_2^t$ includes accessing the first memory location (e.g. 310) that stores the circulant content of portion B and accessing the second memory location that stores a circulant column count of portion B to reconstruct portion B, as described above. This allows sparse calculation block 425 to multiply first parity information $P_1^t$ by portion B 210, for example. Generating the second parity information data $P_2^t$ may also include summing the output of sparse calculation block 425 with buffer 440, which stores product of multiplying the information data by A. Therefore, processing efficiency is achieved by accessing buffer 440 to access (A*$u^t$) in generating second parity information data $P_2^t$ rather than requiring additional hardware and/or processing steps to generate second parity information $P_2^t$. Sum logic (e.g. sum logic 455) may sum the output of sparse calculation block 425 with the content of buffer 440. The sum logic may include exclusive-OR logic, for example. In process block 614, the information data, the first parity information $P_1^t$ and the second parity information $P_2^t$ is stored in a memory location (e.g. memory location in memory array) of a memory system.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A memory system comprising:
an array of memory locations; and
a low density parity check (LDPC) encoder for irregular LDPC codes, the LDPC encoder comprising:
a first encoder memory location storing circulant contents of A, C, E, and B, where A, C, E, and B are portions of a parity check matrix H;
a circulant pointer that points to a first address of the first encoder memory location, the first address marking a start of the circulant content of E;
a second encoder memory location storing circulant column counts of A, C, E, and B;
a column count pointer that points to a second address of the second encoder memory location, the second address marking a start of the circulant column count of E; and
a third encoder memory location configured to reduce a processing burden by storing a pre-calculated dense matrix, wherein the pre-calculated dense matrix is equal to $(ET^{-1}B+D)^{-1}$, wherein T is an identity matrix, wherein the third encoder memory location is further configured to reduce a memory requirement by not storing T in the array of memory locations, wherein D and T are also portions of the parity check matrix H, and wherein the encoder is configured to receive information data, $u^t$, and configured to:
generate a first product by multiplying the information data by (E*A+C), wherein generating the first product includes using the circulant pointer and the column count pointer to access the first and second encoder memory locations;
generate first parity information $P_1^t$ by multiplying the pre-calculated dense matrix by the first product;
generate second parity information $P_2^t$, where the second parity information equals $(A*+u^t+B*P_1^t)$; and
generate an irregular LDPC code based on the second parity information.

2. The memory system of claim 1, wherein multiplying the information data by (E*A+C) further includes:
determining the start of the circulant content of E by accessing the circulant pointer; and
determining the start of the circulant column count of E by accessing the column count pointer.

3. The memory system of claim 1, wherein multiplying the information data by (E*A+C) further includes:
generating a second product by multiplying the information data by A; and
storing the second product in a buffer, and wherein generating the second parity information $P_2^t$ further includes:
accessing the second product from the buffer; and
adding the second product to a third product of the first parity information $P_1^t$ and B, wherein B is reconstructed from the circulant content of B stored in the first encoder memory location and the circulant column count of B stored in the second encoder memory location.

4. The memory system of claim 1, wherein multiplying the information data by (E*A+C) further includes:
multiplying the information data by C in a first circulant-based sparse calculation to generate a first result, wherein C is reconstructed from a circulant content of C stored in the first encoder memory location and a circulant column count of C stored in the second encoder memory location;
multiplying the information data by A in a second circulant-based sparse calculation to generate a second result, wherein A is reconstructed from a circulant content of A stored in the first encoder memory location and a circulant column count of A stored in the second encoder memory location;
multiplying the second result by E in a third circulant-based sparse calculation to generate a third result, wherein E is reconstructed from a circulant content of E stored in the first encoder memory location and a circulant column count of E stored in the second encoder memory location; and
summing the third result and the first result.

5. The memory system of claim 4, wherein summing the first result and the third result is performed by exclusive-OR logic.

6. The memory system of claim 1, wherein generating the first parity information $P_1^t$ by multiplying the pre-calculated dense matrix by the first product is performed by dense matrix calculation logic that includes multiple AND and XOR gates.

7. The memory system of claim 1, wherein a size of the first encoder memory location is larger than the second encoder memory location.

8. The memory system of claim 1, wherein the first, second, and third encoder memory locations are SRAM (Static Random-Access Memory) memory locations.

9. The memory system of claim 1, wherein the encoder is further configured to: store the information data, the first parity information, and the second parity information in a memory location in the array of memory locations.

10. The memory system of claim 9, wherein the array of memory locations is an array of NAND flash memory locations.

11. A method for use in a low density parity check (LDPC) encoder for irregular LDPC codes of a memory system, the method comprising:
receiving information data, $u^t$;
multiplying the information data by (E*A+C), where E, A, and C are portions of a parity check matrix H, wherein multiplying the information data by (E*A+C) includes:
  accessing a first memory location that stores a circulant content of A, C, and E;
  accessing a circulant pointer that points to a first address of the first memory location that marks a start of a circulant content of E;
  accessing a second memory location that stores a circulant column count of A, C, and E; and
  accessing a column count pointer that points to a second address of the second memory location that marks a start of the circulant column count of E;
storing a first product of multiplying the information data by (E*A+C) in a first buffer;
accessing a third memory location configured to reduce a processing burden by storing a pre-calculated dense matrix, wherein the pre-calculated dense matrix is equal to $(ET^{-1}B+D)^{-1}$, wherein T is an identity matrix, wherein the third memory location is further configured to reduce a memory requirement by not storing T in an array of memory locations, and wherein D and T are also portions of the parity check matrix H;
generating first parity information $P_1^t$ by multiplying the pre-calculated dense matrix by the first product;
generating second parity information $P_2^t$, where the second parity information equals $(A*u^t+B*P_1^t)$, generating the second parity information including:
  accessing the first memory location that stores a circulant content of B, where B is a portion of the parity check matrix H; and
  accessing the second memory location that stores a circulant column count of B; and
generating an irregular LDPC code based on the second parity information.

12. The method of claim 11, wherein multiplying the information data by (E*A+C) further includes:
determining the start of the circulant content of E by accessing the circulant pointer; and
determining the start of the circulant column count of E by accessing the column count pointer.

13. The method of claim 11, wherein multiplying the information data by (E*A+C) further includes:
generating a second product by multiplying the information data by A; and
storing the second product in a second buffer, and wherein generating the second parity information $P_2^t$ further includes:
accessing the second product from the second buffer; and
adding the second product to a third product of the first parity information $P_1^t$ and B, wherein B is reconstructed from the circulant content of B stored in the first memory location and the circulant column count of B stored in the second memory location.

14. The method of claim 11, wherein multiplying the information data by (E*A+C) further includes:
multiplying the information data by C in a first circulant-based sparse calculation to generate a first result, wherein C is reconstructed from a circulant content of C stored in the first memory location and a circulant column count of C stored in the second memory location;
multiplying the information data by A in a second circulant-based sparse calculation to generate a second result, wherein A is reconstructed from a circulant content of A stored in the first memory location and a circulant column count of A stored in the second memory location;
multiplying the second result by E in a third circulant-based sparse calculation to generate a third result, wherein E is reconstructed from a circulant content of E stored in the first memory location and a circulant column count of E stored in the second memory location; and
summing the third result and the first result.

15. The method of claim 11, wherein generating the first parity information $P_1^t$ by multiplying the pre-calculated dense matrix by the first product is performed by dense matrix calculation logic that includes multiple AND and XOR gates.

16. The method of claim 11, wherein a size of the first memory location is larger than the second memory location.

17. The method of claim 11, wherein the first, second, and third memory locations are SRAM (Static Random-Access Memory) memory locations.

18. The method of claim 11 further comprising storing the information data, the first parity information, and the second parity information in a memory location of a memory system.

19. The method of claim 18, wherein the memory location is one of an array of NAND flash memory locations.

20. The memory system of claim 1, wherein the third encoder memory location is accessed based on the circulant pointer and the column count pointer.

* * * * *